(12) United States Patent
Bickham et al.

(10) Patent No.: US 11,287,567 B2
(45) Date of Patent: Mar. 29, 2022

(54) SINGLE-MODE LARGE EFFECTIVE AREA OPTICAL FIBERS WITH LOW CUTOFF WAVELENGTH

(71) Applicant: Corning Incorporated, Corning, NY (US)

(72) Inventors: Scott Robertson Bickham, Corning, NY (US); Dana Craig Bookbinder, Corning, NY (US); Ming-Jun Li, Horseheads, NY (US); Snigdharaj Kumar Mishra, Wilmington, NC (US); Pushkar Tandon, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/419,403

(22) Filed: May 22, 2019

(65) Prior Publication Data

US 2019/0361170 A1    Nov. 28, 2019

Related U.S. Application Data

(60) Provisional application No. 62/676,328, filed on May 25, 2018.

(51) Int. Cl.
    *G02B 6/028*    (2006.01)
    *G02B 6/02*    (2006.01)
    *H01S 5/183*    (2006.01)

(52) U.S. Cl.
    CPC ....... *G02B 6/0288* (2013.01); *G02B 6/02004* (2013.01); *H01S 5/183* (2013.01)

(58) Field of Classification Search
    CPC .............. G02B 6/0288; G02B 6/02004; G02B 6/0365; G02B 6/02009; H01S 5/183
    See application file for complete search history.

(56) References Cited

U.S. PATENT DOCUMENTS

| | | | |
|---|---|---|---|
| 5,410,567 A | 4/1995 | Brundage et al. | |
| 6,027,062 A | 2/2000 | Bacon et al. | |
| 7,565,820 B2 | 7/2009 | Foster et al. | |
| 7,680,381 B1 | 3/2010 | Bookbinder et al. | |
| 7,832,675 B2 | 11/2010 | Bumgarner et al. | |

(Continued)

FOREIGN PATENT DOCUMENTS

WO    2018063865 A1    4/2018

OTHER PUBLICATIONS

Barwics et al; (IBM), "Assembly of Mechanically Compliant Interfaces Between Optical Fibers and Nanophotonic Chips," 2014 Electronic Components & Technology Conference; 7 Pages.

(Continued)

*Primary Examiner* — John Bedtelyon (57) ABSTRACT

Optical fibers having a large effective area and a low cutoff wavelength are disclosed. Three main embodiments of the optical fiber allow for single-mode operation at wavelengths greater than 980 nm, and have a large effective area with low bend losses and low dispersion at 1310 nm. The large effective area optical fiber is expected to be particularly useful for data center applications due to its ability to efficiently optically couple with VCSELs and photonic integrated devices. Integrated systems and optical communication systems that employ the optical fibers are also disclosed.

19 Claims, 6 Drawing Sheets

(56) References Cited

U.S. PATENT DOCUMENTS

| | | | |
|---|---|---|---|
| 2007/0189684 A1* | 8/2007 | Matsuo | G02B 6/02 |
| | | | 385/123 |
| 2008/0056654 A1 | 3/2008 | Bickham et al. | |
| 2010/0027951 A1* | 2/2010 | Bookbinder | G02B 6/0365 |
| | | | 385/127 |
| 2011/0064368 A1 | 3/2011 | Bookbinder et al. | |
| 2016/0313502 A1 | 10/2016 | Bickham et al. | |
| 2016/0377801 A1* | 12/2016 | Bickham | G02B 6/02395 |
| | | | 398/182 |

OTHER PUBLICATIONS

Rosenberg et al. (HPE, USCONEC), "CWDM Transceiver for Mid-Board Optics," Invited Talk Presented at Photonics West 2017, San Francisco; 12 Pages.

Weiss et al; (IBM Research Zurich, Switzerland), "Optical Interconnects for Disaggregated Resources in Future Datacenters", ECOC 2014, Cannes France; 3 Pages.

International Search Report and Written Opinion of the International Searching Authority; PCT/US2019/032812; dated Jul. 23, 2019; 12 Pgs.

* cited by examiner

FIG. 3B

SINGLE-MODE LARGE EFFECTIVE AREA OPTICAL FIBERS WITH LOW CUTOFF WAVELENGTH

This application claims the benefit of priority to U.S. Provisional Application Ser. No. 62/676,328 filed on May 25, 2018, the content of which is relied upon and incorporated herein by reference in its entirety.

FIELD

The present disclosure relates to optical fibers, and in particular, to single-mode large effective area optical fibers with low cutoff wavelengths.

BACKGROUND

The need for greater bandwidth and higher data transmission rates has motivated efforts to develop next-generation platforms for information storage and delivery. It is widely believed that optical information systems will provide superior performance to today's microelectronics-based systems. In addition, in data center systems based on 850 nm VCSELs transmitting over multimode fiber, chromatic dispersion is a limiting factor for high data rates and/or long reach links because of the large transceiver linewidth associated with these VCSELs. Integrated optical systems based on silicon photonics or long wavelength VCSELs are a leading replacement technology for microelectronic systems. Silicon photonics interfaces with standard CMOS technologies and WDM (wavelength division multiplexing) to convert electrical signals to optical signals, to transmit optical signals, and to reconvert optical signals to electrical signals. In disaggregated systems, transfer of signals between units occurs through optical links that provide high bandwidth and high data transfer rates.

Data centers with disaggregated architecture are being proposed for future data centers, involving use of silicon photonics and WDM technology. While a some of these systems have focused on using multimode optical fibers, the finite modal bandwidth of these multimode fibers limits transmission distances to a few hundred meters. System architectures using single-mode fibers are therefore contemplated to enable transmission over the 500-2000 m distances that are becoming increasingly common in hyperscale data centers and campus backbones. Consequently, there is a need for suitable optical fibers for such data center applications and like applications.

SUMMARY

Single-mode optical fibers having a large effective area and a low cutoff wavelength that provide a differential advantage in data center applications using single-mode lasers are disclosed.

An aspect of the disclosure is an optical fiber that includes: (i) a silica based core region comprising an outer radius $r_1$ in the range from 3.6 to 5.4 microns, a maximum relative refractive index $\Delta_{1MAX}$ between 0.25 to 0.4%, and core volume $V_1$ between 3.0%-sq. microns and 4.6%-sq. microns; (ii) a depressed index cladding region surrounding the core region, the depressed index cladding region comprising an inner radius $r_2$ such that $r_1/r_2$ is greater than 0.4, an outer radius $r_3$ and a minimum relative refractive index $\Delta_{3MIN}$ less than $-0.2\%$, and a trench volume $V_3$ less than $-20\%$ $\Delta$-sq. microns; (iii) an outer cladding region surrounding the depressed index cladding region, the outer cladding region comprising an outer radius $r_4$;

wherein the optical fiber has: a mode field diameter (MFD) at 1310 nm such that 9.5 microns≥MFD≥8.6 microns; a cable cutoff wavelength≤1060 nm; a bending loss at 1310 nm, as determined by the mandrel wrap test using a mandrel comprising a diameter of 15 mm, of ≤1.0 dB/turn; and a zero dispersion wavelength ($\lambda_0$) between 1300 nm and 1324 nm. According to some embodiments the mode field diameter (MFD) at 1310 nm is between 8.8 and 9.4 microns According to some embodiments the ration $r_1/r_2$ is greater than 0.4 and less than 0.65.

According to some embodiments the core region has an alpha value $\alpha>5$, and $r_1/r_2$ is greater than 0.4 and less than or equal to 0.5. According to some embodiments the core region has an alpha value $\alpha<5$, and $r_1/r_2$ is greater than 0.5 and less than 0.65.

According to some embodiments the optical fiber has an effective area at 1310 nm of at least 60 sq. microns.

According to the embodiments described herein, the optical fibers advantageously provide single-mode operation at wavelengths less than 1080 nm, less than 1060 nm, or even less than 980 nm (as well as wavelength bands that include these wavelengths, e.g., 980-1080 nm and/or 1050-1080 nm); and have G.652D-compliant mode field diameters and zero dispersion wavelengths; and provide low bend loss at a wavelength of 1310 nm.

According to at least some embodiments an optical fiber has a large effective area (e.g. between 58 and 72 sq. microns) and low dispersion magnitude (e.g., between −1.0 and 1.0 ps/nm/km) at an operating wavelength of about 1310 nm while still having a low cable cutoff wavelength, with the fiber refractive index profiles comprising a trench (depressed index cladding region) structured and positioned to improve bend performance.

According to some embodiments an integrated system comprises the optical fibers described above; and one or more lasers optically coupled to the optical fiber and that emits light at one or more wavelengths in the 1310 nm window, which encompasses the wavelength range from 1260 and 1360 nm.

According to some embodiments an integrated system comprises the optical fibers described above; and one or more vertical-cavity surface-emitting lasers (VCSELs) optically coupled to the optical fiber and that emits light at one or more wavelengths between 980 and 1080 nm, for example 990 nm, 1015 nm, 1040 nm and/or 1064 nm.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

Definitions and Terminology

The "refractive index profile" is the relationship between the refractive index or relative refractive index and the fiber radius r. For relative refractive index profiles depicted herein as having step boundaries between adjacent core and/or cladding regions, normal variations in processing conditions may preclude obtaining sharp step boundaries at the interface of adjacent regions. It is to be understood that although boundaries of refractive index profiles may be depicted herein as step changes in refractive index, the boundaries in practice may be rounded or otherwise deviate from perfect step function characteristics. It is further understood that the value of the relative refractive index may vary with radial position within the core region and/or any of the cladding regions.

When the relative refractive index varies with radial position in a particular region of the fiber (core region and/or any of the cladding regions), it may be expressed in terms of its actual or approximate functional dependence or in terms of an average value applicable to the region. Unless otherwise specified, if the relative refractive index of a region (core region and/or any of the cladding regions) is expressed as a single value, it is understood that the relative refractive index in the region is constant, or approximately constant, and corresponds to the single value or that the single value represents an average value of a non-constant relative refractive index dependence with radial position in the region. Whether by design or a consequence of normal manufacturing variability, the dependence of relative refractive index on radial position may be sloped, curved, or otherwise non-constant.

Thus, the "relative refractive index," as used herein, is defined as:

$$\Delta_i \% = 100 \frac{(n_i^2 - n_{ref}^2)}{2 n_i^2} \quad (1)$$

where $n_i$ is the maximum refractive index in region i, unless otherwise specified, and $n_{ref}$ is the refractive index of pure silica glass, unless otherwise specified, which has a value of 1.444 at a wavelength of 1550 nm. As used herein, the relative refractive index is represented by $\Delta$ (or "delta") or $\Delta \%$ (or "delta %") or $\% \Delta$ and its values are given in units of "%", unless otherwise specified. Relative refractive index may also be expressed as $\Delta(r)$ or $\Delta(r) \%$.

The "alpha parameter" of the core region, or "α-parameter" or "alpha value" or just "α" refers to a parameter used to define a relative refractive index profile $\Delta(r)$ ("alpha profile") that has the following functional form:

$$\Delta(r) = \Delta(r_0)\left[1 - \left[\frac{|r - r_0|}{(r_1 - r_0)}\right]^\alpha\right] \quad (2)$$

where $r_o$ is the initial point of the alpha-profile, $r_1$ is the point where the extrapolated $\Delta(r)$ reaches a value of zero, and r is in the range $r_0 \le r \le r_f$, where $r_f$ is the final point of the alpha-profile, and α is a real number. For cores in which the alpha profile begins at the centerline, $r_0=0$. It is to be understood that Eq. (1) is an idealized representation of the shape of the refractive index profile of the core region of an actual fiber. The relative refractive index of the core of an actual fiber may not reach absolute zero due to diffusion and other phenomena, but the functional form between $r=r_0$ and $r=r_f$ may still be parameterized using Eq. (1), and a least squares fit will yield accurate values for $\Delta(r_0)$, $r_1$ and α.

The "core volume" $V_1$ is defined as:

$$V_1 = 2\int_0^{r_1} \Delta_1(r) r \, dr$$

Where $r_1$ is the outer radius of the refractive index profile of the core region, $\Delta_1(r)$ is the relative refractive index of the core region of the refractive index profile, and r is radial position in the fiber. The core volume $V_1$ is a positive quantity and will be expressed herein in units of $\% \Delta$-$\mu m^2$, which may also be expressed as $\% \Delta \mu m^2$ or $\% \Delta$-micron$^2$, or $\% \Delta$-sq. microns.

The "effective area" of an optical fiber is denoted $A_{eff}$ and is defined as:

$$A_{eff} = \frac{2\pi \left[\int_0^\infty (f(r))^2 r \, dr\right]^2}{\int_0^\infty (f(r))^4 r \, dr}$$

Where f(r) is the transverse component of the electric field of the guided optical signal and r is radial position in the fiber. The effective area $A_{eff}$ depends on the wavelength of the optical signal. Specific indication of the wavelength will be made when referring to the effective area $A_{eff}$ herein.

The "mode field diameter" or "MFD" of an optical fiber is determined using the Peterman II method, wherein:

$$MFD = 2w$$

$$w = \left[2\frac{\int_0^\infty (f(r))^2 r\,dr}{\int_0^\infty \left(\frac{df(r)}{dr}\right)^2 r\,dr}\right]^{1/2}$$

where f(r) is the transverse component of the electric field distribution of the guided optical signal and r is radial position in the fiber. The MFD depends on the wavelength of the optical signal and is reported herein for wavelengths of 1064 nm and 1310 nm. Specific indication of the wavelength will be made when referring to a mode field diameter.

The "Trench volume" $V_3$ is defined as:

$$V_3 = 2\int_{r_2}^{r_3} \Delta_3(r) r\,dr$$

where $r_2$ is the inner radius of the trench region of the refractive index profile (i.e., the inner radius of the depressed index cladding region), $r_3$ is the outer radius of the trench region of the refractive index profile, $\Delta_3(r)$ is the relative refractive index of the trench region of the refractive index profile, and r is radial position in the fiber. The trench volume $V_3$ is a negative quantity and will be expressed herein in units of % $\Delta$-$\mu m^2$, which may also be expressed as % $\Delta\mu m^2$ or % $\Delta$-$micron^2$, or % $\Delta$-sq. microns.

The "chromatic dispersion" D of an optical fiber is referred to as "dispersion" herein unless otherwise noted and is the sum of the material dispersion, the waveguide dispersion, and the intermodal dispersion. In the case of single mode waveguide fibers, the inter-modal dispersion is zero. The zero dispersion wavelength ($\lambda_0$) is the wavelength at which the dispersion has a value of zero. The dispersion slope DS is the rate of change of dispersion with respect to wavelength.

The cutoff wavelength of an optical fiber is the minimum wavelength at which the optical fiber will support only one propagating mode. For wavelengths below the cutoff wavelength, multimode transmission may occur and intramodal dispersion may limit the fiber's information carrying capacity. The fiber cutoff wavelength and cabled fiber cutoff (also referred to as the cable cutoff) wavelengths can be measured according to the procedures defined in FOTP-80 IEC-60793-1-44 Optical Fibres—Part 1-44: Measurement Methods and Test Procedures—Cut-Off Wavelength. All methods require a reference measurement, which for the case of a bend-insensitive single-mode fiber should be the multimode-reference technique rather than the bend-reference technique.

The bend resistance of an optical fiber may be gauged by bend-induced attenuation under prescribed test conditions. Various tests are used in the art to assess bending losses in fibers. For purposes of the present disclosure, bending losses BL are determined by a mandrel wrap test. In the mandrel wrap test, the fiber is wrapped around a mandrel having a specified diameter and the increase in attenuation due to the bending (relative to a straight fiber) at a particular wavelength is determined. Attenuation in the mandrel wrap test is expressed in units of dB/turn, where one turn refers to one revolution of the fiber about the mandrel.

The "pin array" bend test is used to compare relative resistance of waveguide fiber to macrobending losses. To perform this test, attenuation loss is measured for a waveguide fiber with essentially no induced bending loss. The waveguide fiber is then woven about the pin array and attenuation again measured. The loss induced by bending is the difference between the two measured attenuations. The pin array is a set of ten cylindrical pins arranged in a single row and held in a fixed vertical position on a flat surface. The pin spacing is 5 mm, center to center. The pin diameter is 0.67 mm. During testing, sufficient tension is applied to make the waveguide fiber conform to a portion of the pin surface. The increase in attenuation is the pin array attenuation in dB of the waveguide at a specified wavelength (typically within the range of 1200-1700 nm, e.g., 1310 nm or 1550 nm or 1625 nm).

The fibers disclosed herein generally include a core region and a cladding region surrounding the core region, as explained in greater detail below. The fibers may also include a primary coating surrounding the cladding region, and a secondary coating surrounding the primary coating. The cladding region may include an inner cladding region and an outer cladding region. The cladding may further include a depressed index cladding region. The depressed index cladding region is a cladding region having a lower relative refractive index than the adjacent cladding regions (e. g, the adjacent inner and/or outer cladding regions). The depressed index cladding region may also be referred to herein as a trench or trench region. The depressed index cladding region may surround the inner cladding region and/or may be surrounded by the outer cladding region. The refractive index profile of the core region may be designed to minimize attenuation losses while maintaining a large mode field diameter for the fiber. The primary and secondary coatings may be selected to protect the mechanical integrity of the core and cladding and to minimize the effects of external mechanical disturbances on the characteristics of the optical signal guided in the fiber. The primary and secondary coatings may insure that losses due to bending and other perturbing forces are minimized. The depressed index cladding region may also contribute to a reduction in bending losses.

Whenever used herein, radius $r_1$ and relative refractive index $\Delta_1(r)$ refer to the core region, radius $r_2$ and relative refractive index $\Delta_2(r)$ refer to the inner cladding region, radius $r_3$ and relative refractive index $\Delta_3(r)$ refer to the depressed index cladding region or "trench" region, and radius $r_4$ and relative refractive index $\Delta_4(r)$ refer to the outer cladding region.

It is understood that the central core region is substantially cylindrical in shape and that the surrounding inner cladding, depressed index cladding, and outer cladding regions are substantially annular in shape. Annular regions may be characterized in terms of an inner radius and an outer radius. Radial positions $r_1$, $r_2$, $r_3$ and $r_4$ (or $R_1$, $R_2$, $R_3$ and $R_4$) refer herein to the outermost radii of the central core region, inner cladding region, depressed index cladding region, outer cladding region, respectively.

When two regions are directly adjacent to each other, the outer radius of the inner of the two regions coincides with the inner radius of the outer of the two regions. In one embodiment, for example, the fiber includes a depressed index cladding region surrounded by and directly adjacent to an outer cladding region. In such an embodiment, the radius $r_3$ or $R_3$ corresponds to the outer radius of the depressed index cladding region and the inner radius of the outer cladding region.

As will be described further hereinbelow, the relative refractive indices $\Delta$ of the central core region, inner cladding region, depressed index cladding region, and outer cladding region may differ and typically do differ. Each of the regions may be formed from silica glass or a silica-based glass incorporating one or more dopants. Variations in refractive index may be accomplished by incorporating updopants or downdopants at levels known to provide a targeted refractive index or refractive index profile using techniques known to those of skill in the art.

Updopants are dopants that increase the refractive index of the glass relative to the undoped glass composition. Downdopants are dopants that decrease the refractive index of the glass relative to the undoped glass composition. In one embodiment, the undoped glass is pure silica glass. When the undoped glass is pure silica glass, updopants may include Cl, Br, Ge, Al, P, Ti, Zr, Nb, and Ta, and downdopants may include F and B. Regions of constant refractive index may be formed by not doping or by doping at a uniform concentration. Regions of variable refractive index may be formed through non-uniform radial distributions of dopants.

The parameters for several embodiments of the optical fibers are set forth in Tables 1A, 1B, and 1C below. Tables 1A-1C set forth a number of the above-described parameters, as well as the following parameters, which are known in the art: The dispersion D, measured in ps/nm/km, the dispersion slope DS, measured in ps/nm²/km; the fiber and cabled fiber cutoff wavelengths, measured in nm; the pin array PA bend loss, measured in dB; and the MFD, measured in microns.

Also in the Tables, the values for the radii, r, are measured or calculated in microns, and the core volume $V_1$ and trench volume $V_3$ are measured or calculated in units of in % Δ-sq. microns.

Example Large Effective Area, Low Cutoff Optical Fibers

The disclosed embodiments of the optical fiber allow for single-mode operation at wavelengths less than 1080 nm, less than 1060 nm or even less than 980 nm (as well as wavelength bands that include these wavelengths, e.g. 980-1080 nm and 1050-1080 nm), have G.652D-compliant mode field diameters and zero dispersion wavelengths, and low bend loss at a wavelength of 1310 nm.

Figure 1A:
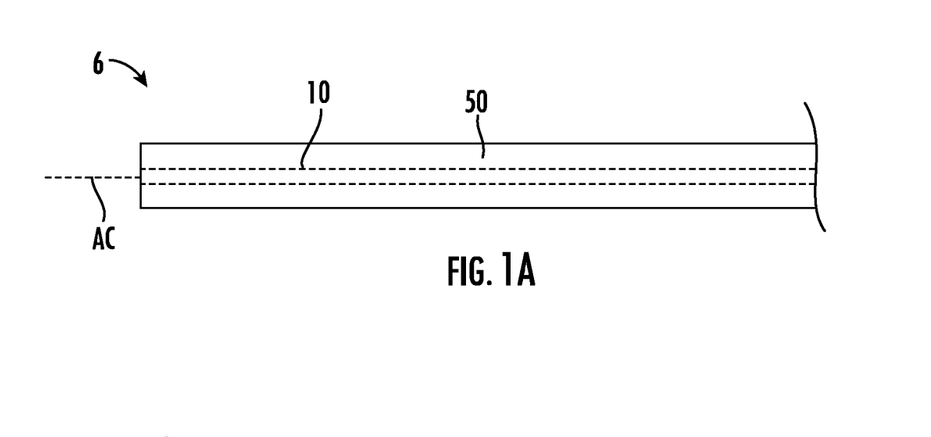
FIG. 1A is a side view and FIG. 1B is a cross-sectional view of an example large effective area, low cable cutoff wavelength optical fiber according to the disclosure.
Figure 1B:
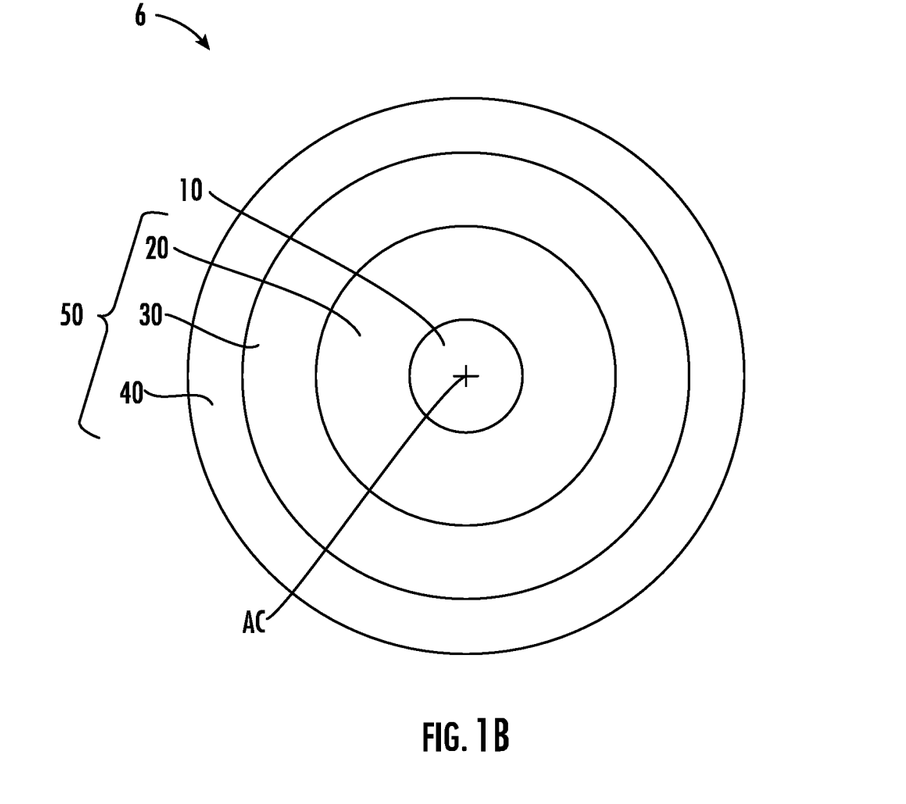

FIG. 1A is a side view and FIG. 1B is a cross-sectional view of an example large effective area, low cutoff optical fiber 6 (hereinafter, "fiber") according to the disclosure. The fiber 6 includes a central axis AC, central core region 10, an optional inner cladding region 20, a third region 30 in the form of a trench and thus referred to as "trench region" 30 or "depressed index cladding region," and a fourth region 40 making up an outer cladding and thus referred to as an "outer cladding region" 40. The optional inner cladding region 20, the trench region 30, and the outer cladding region 40 collectively define a cladding section 50.

Figure 2A:
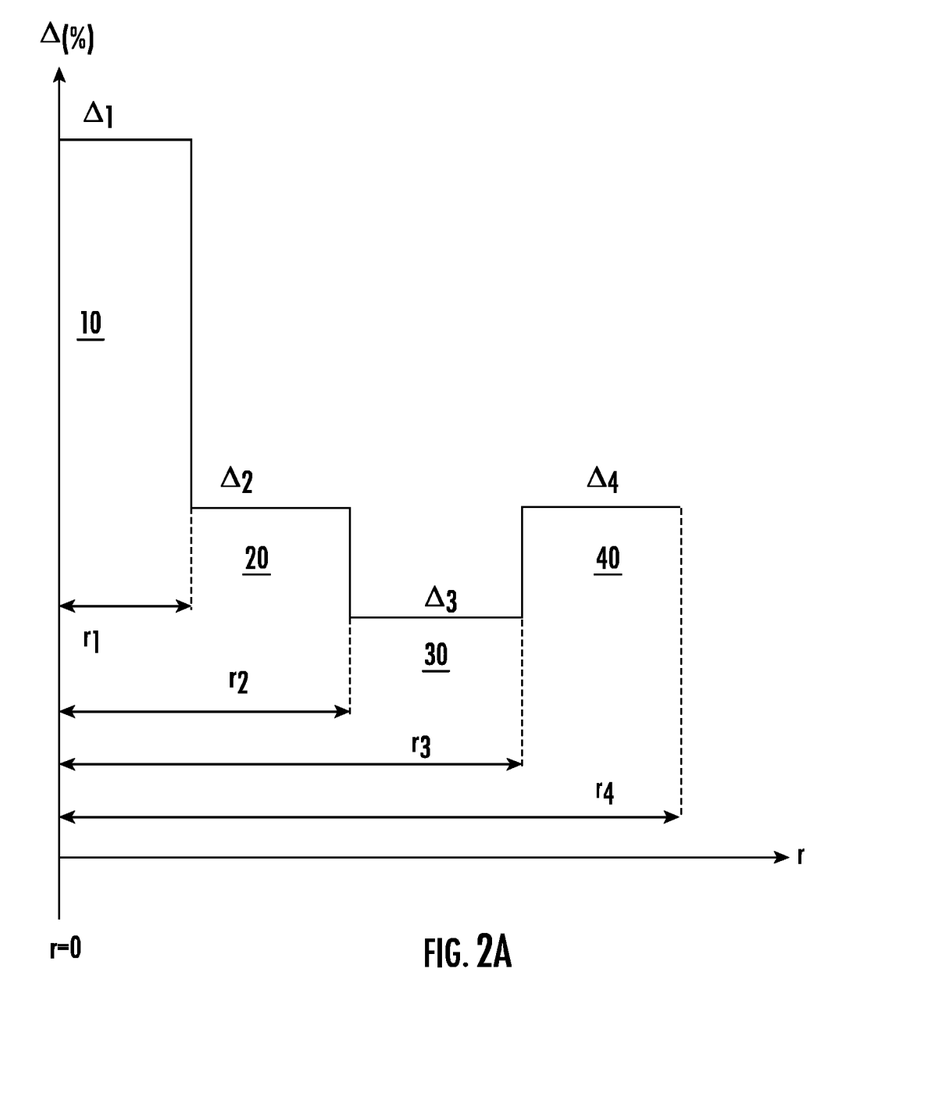
FIGS. 2A, 2B, 2C, and 2D are plots of the relative refractive index profiles of the large effective area, low cable cutoff wavelength optical fiber embodiment of FIG. 1A.
Figure 2B:
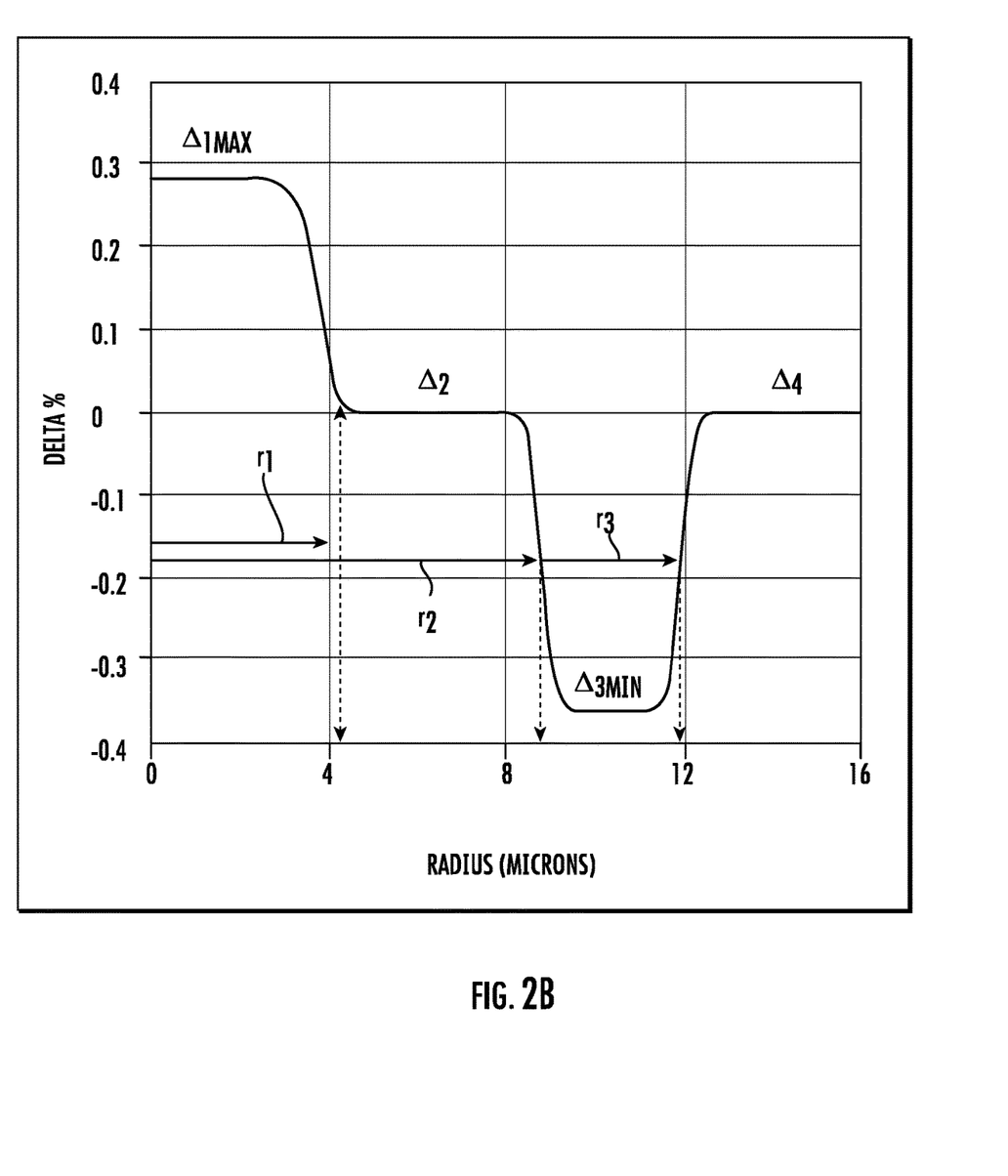
Figure 2C:
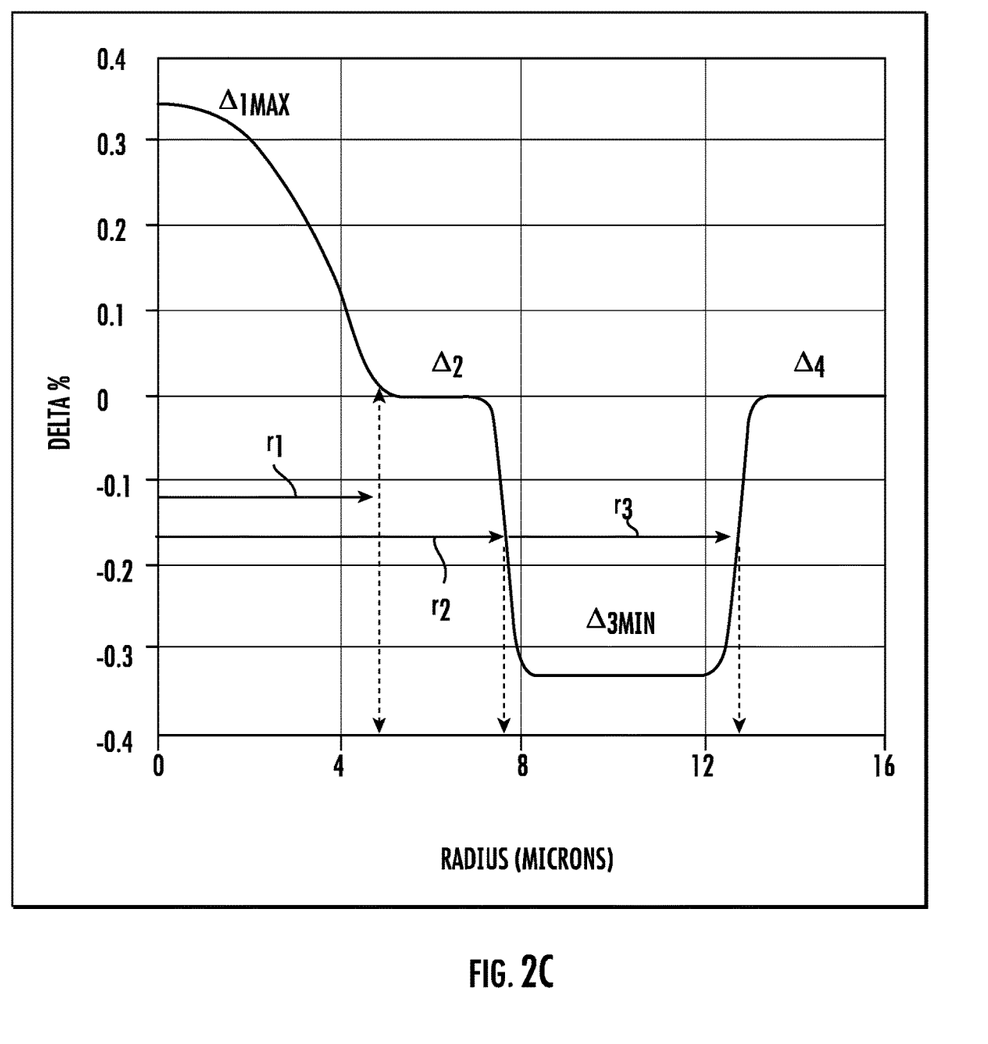
Figure 2D:
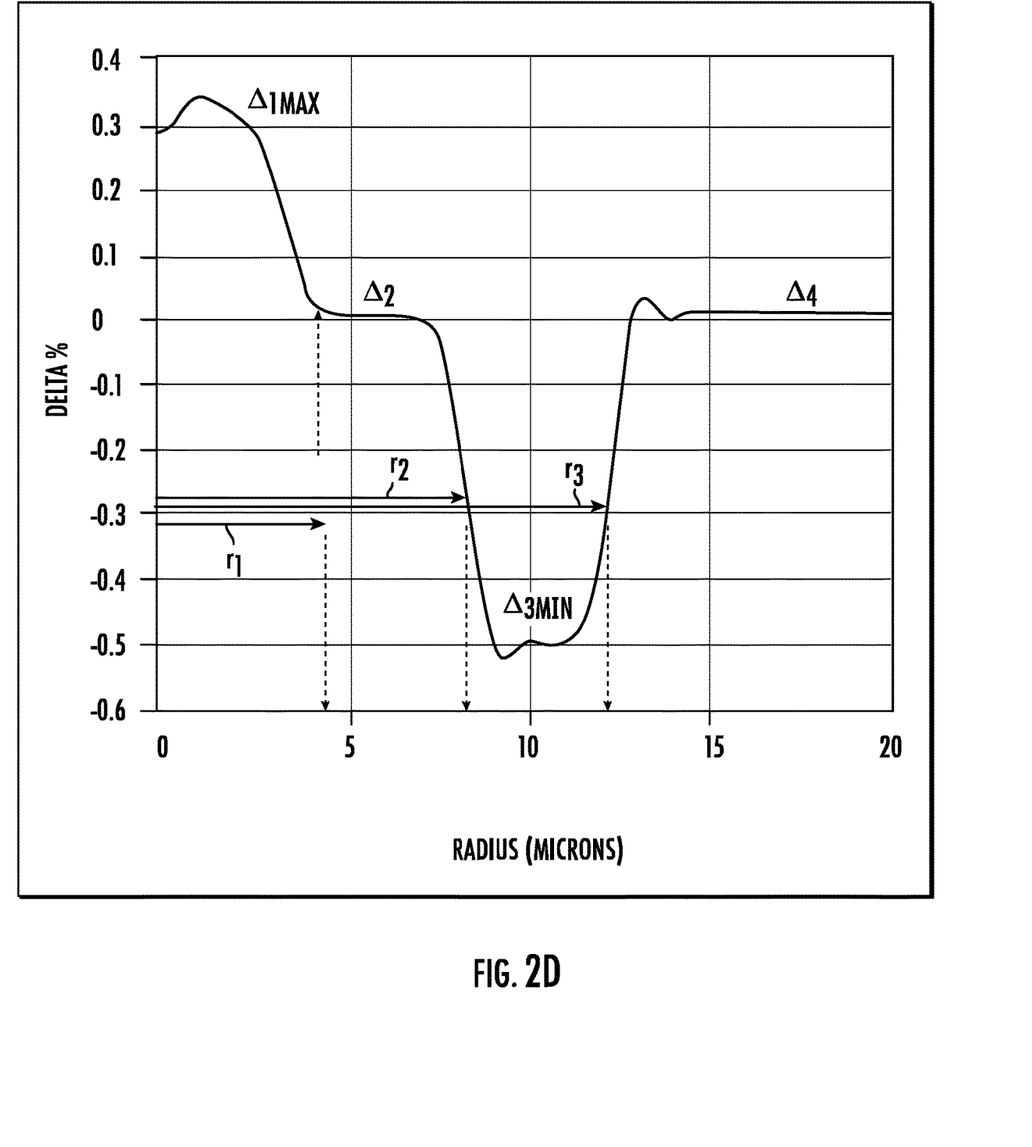

FIG. 2A is a plot of the one exemplary relative refractive index profile Δ(%) versus fiber radius r of the fiber 6 of FIGS. 1A and 1B. The plot is from the central axis AC radially outward, i.e., from R=0. The core region 10 has outer radius $r_1$ and maximum relative refractive index $\Delta_{1MAX}$, which in these examples occurs at $r_0=0$. The outer radius of the core $r_1$ is determined from a least square fit of the relative refractive index of the core to Eq. (2). The inner cladding region 20 extends from the radial position $r_1$ to a radial position $r_2$ and has minimum relative refractive index $\Delta_{2MIN}$, where $r_2$ is defined as the first radius where $\Delta(r)=\Delta_{3MIN}/2$. The trench region 30 extends from the radial position $r_2$ to a radial position $r_3$ and has relative refractive index 43, where $r_3$ is defined as the second radius where $\Delta(r)=\Delta_{3MIN}/2$. The outer cladding region 40 extends from the radial position $r_3$ to radial position $r_4$ and has relative refractive index $\Delta_4$. FIGS. 2B, 2C and 2D are plots of the other exemplary relative refractive index profiles Δ(%) versus fiber radius r of the fiber 6 of FIG. 1A.

In the profiles of FIGS. 2A-2C the trench region 30 in the cladding may have a constant refractive index that is less than the refractive indices of the inner cladding region 20 and the outer cladding region 40. Core region 10 has the highest relative refractive index in the profile. The core region 10 may include a lower index region at or near the centerline (known in the art as a "centerline dip") (not shown).

The relative ordering of relative refractive indices $\Delta_1$, $\Delta_2$, $\Delta_3$, and $\Delta_4$ satisfy the conditions $\Delta_1 > \Delta_4 > \Delta_3$ and $\Delta_1 > \Delta_2 > \Delta_3$. The values of $\Delta_2$ and $\Delta_4$ may be equal or either may be greater than the other, but both $\Delta_2$ and $\Delta_4$ are between $\Delta_1$ and $\Delta_3$.

The core and cladding regions of fiber 6 may be produced in a single-step process or multi-step process by methods which are well known in the art. Suitable methods include: the double crucible method, rod-in-tube procedures, and doped deposited silica processes, also commonly referred to as chemical vapor deposition ("CVD") or vapor phase oxidation. A variety of CVD processes are known and are suitable for producing the core and cladding layer used in the coated optical fibers of the present invention. They include external CVD processes, axial vapor deposition processes, modified CVD (MCVD), inside vapor deposition, and plasma-enhanced CVD (PECVD).

The glass portion of the coated fibers may be drawn from a specially prepared, cylindrical preform which has been locally and symmetrically heated to a temperature sufficient to soften the glass, e.g., a temperature of about 2000° C. for a silica glass. As the preform is heated, such as by feeding the preform into and through a furnace, a glass fiber is drawn from the molten material. See, for example, U.S. Pat. Nos. 7,565,820; 5,410,567; 7,832,675; and 6,027,062; the disclosures of which are hereby incorporated by reference herein, for further details about fiber making processes.

Examples

Tables 1A though 1B below set forth design parameters for an example fiber 6 that permits operating wavelengths λ between about 980 nm and 1360 nm and has a cutoff wavelength that is less than 1060 nm. Tables 1A, 1B and 1C set forth a number of exemplary refractive index profiles having a gradient index core, a depressed index cladding region (trench region) 30, with a cable cutoff of less than 1060 nm (and in some embodiments <1040 nm, <1020 nm, or even <1000 nm).

In some embodiments the effective area Aeff at 1310 nm is between 58 and 72 sq. microns. In some embodiments the effective area Aeff at 1310 nm is between 60 and 70 sq. microns. In some embodiments the effective area Aeff at 1310 nm is between 62 and 70 sq. microns.

In some embodiments the mode field diameter MFD at 1310 nm is between 8.6 microns and 9.5 microns. In some embodiments the mode field diameter MFD at 1310 nm is between 8.8 microns and 9.5 microns. In some embodiments the mode field diameter MFD at 1310 nm is between 8.8 microns and 9.4 microns.

In some embodiments the core volume $V_1$ is between 3.0%-sq. microns and 4.6%-sq. microns, and in some embodiments between 3.4%-sq. microns and 4.4%-sq. microns.

In some embodiments the trench volume $V_3$ is less than −20% Δ-sq. microns; in other embodiments, $V_3$ is greater than −80% Δ-sq. microns; in other embodiments $V_3$ is between −80 and −20% Δ-sq. microns; in other embodiments the trench volume $V_3$ is between −70% Δ-sq. microns and −30% Δ sq. microns; and in still other embodiments the trench volume $V_3$ is between −60% Δ- sq. microns and −30% Δ-sq. microns.

In some embodiments the pin-array loss bend PA at 1310 nm is less than 20 dB, in other embodiments the pin-array bend loss PA at 1310 nm is less than 15 dB, in still other embodiments the pin-array loss PA at 1310 nm is less than 10 dB, and in yet another embodiment the pin-array bend loss PA at 1310 nm is less than 8 dB.

In an example, the bend loss BL at 1310 nm for a 10 mm diameter mandrel is less than 1.0 dB/turn, or less than 0.5 dB/turn, or less than 0.3 dB/turn. In another example, the bend loss BL at 1310 nm for a 15 mm diameter mandrel is less than 1.0 dB/turn, or less than 0.5 dB/turn, or less than 0.3 dB/turn, or less than 0.2 dB/turn. Also in an example, the bend loss BL at 1310 nm for a 20 mm diameter mandrel is less than 0.2 dB/turn, or less than 0.1 dB/turn. Also in an example, the bend loss BL at 1310 nm for a 30 mm diameter mandrel is less than 0.1 dB/turn, or even less than 0.05 dB/turn.

According to some embodiments the fiber has a cable cutoff wavelength<1060 nm, for example <1060 nm, <1040 nm, <1020 nm, <1010 nm, or even <1000 nm. According to at least some embodiments the LP11 mode of the optical fiber has a theoretical cutoff wavelength of 1000 nm or less.

According to some embodiments the fiber has a zero dispersion wavelength ($\lambda_0$) between 1300 and 1324 nm. According to the embodiments described herein the ratio of the core outer radius $r_1$ to the inner radius $r_2$ of the depressed index cladding region 30 is >0.4, which in conjunction with other parameters enables the fiber to have a zero dispersion wavelength ($\lambda_0$) in a range of between 1300 nm and 1324 nm. In some embodiments $0.7>r_1/r_2>0.4$. In some embodiments where core alpha is greater than 5, $0.5>r_1/r_2>0.4$, and in some of these embodiments $0.48>r_1/r_2>0.42$. In some embodiments where core alpha is less than 5, $0.65>r_1/r_2>0.5$, and in some of these embodiments, $0.65>r_1/r_2>0.55$.

TABLE 1A

| Parameter | Example 1 | Example 2 | Example 3 | Example 4 |
|---|---|---|---|---|
| $\Delta_{1MAX}$ (%) | 0.284 | 0.284 | 0.275 | 0.288 |
| $r_1$ (microns) | 4.07 | 4.04 | 4.11 | 4.00 |
| $V_1$ (%-sq. microns) | 3.97 | 3.88 | 3.94 | 3.89 |
| Alpha | 11.06 | 10.14 | 11.38 | 10.90 |
| $\Delta_2$ (%) | 0.0 | 0.0 | 0.0 | 0.0 |
| $r_2$ (microns) | 8.78 | 8.96 | 9.00 | 7.94 |
| $\Delta_{3MIN}$ (%) | −0.36 | −0.29 | −0.28 | −0.36 |
| $r_3$ (microns) | 11.90 | 13.75 | 14.67 | 13.63 |
| $r_1/r_2$ | 0.46 | 0.45 | 0.46 | 0.50 |
| $V_3$ (%-sq. microns) | −23.0 | −31.5 | −37.2 | −43.7 |
| $\Delta_4$ (%) | 0.0 | 0.0 | 0.0 | 0.0 |
| $r_4$ (microns) | 62.5 | 62.5 | 62.5 | 62.5 |
| LP11 theoretical cutoff (microns) | 1.003 | 0.995 | 1.002 | 0.984 |
| MFD @ 1064 (microns) | 8.10 | 8.09 | 8.23 | 7.95 |
| MFD @ 1310 (microns) | 9.28 | 9.31 | 9.46 | 9.04 |
| Aeff at 1310 nm (sq. microns) | 66.5 | 66.8 | 68.9 | 63.4 |
| Pin array bend loss @ 1310 (dB) | 14.91 | 14.10 | 14.38 | 10.92 |
| Dispersion @ 1310 nm (ps/nm/km) | −0.05 | −0.48 | −0.18 | 0.62 |
| Slope @ 1310 nm (ps/nm²/km) | 0.092 | 0.092 | 0.092 | 0.093 |
| Zero dispersion wavelength (nm) | 1311 | 1315 | 1312 | 1303 |
| Cabled fiber cutoff (nm) | 975.7 | 983.5 | 1012.2 | 1022.8 |

TABLE 1B

| Parameter | Example 5 | Example 6 | Example 7 | Example 8 |
|---|---|---|---|---|
| $\Delta_{1MAX}$ (%) | 0.315 | 0.333 | 0.325 | 0.348 |
| $r_1$ (microns) | 4.74 | 4.66 | 4.59 | 4.77 |
| $V_1$ (%-sq. microns) | 4.11 | 3.89 | 4.05 | 4.32 |
| Alpha | 2.78 | 2.33 | 2.90 | 2.41 |
| $\Delta_2$ (%) | 0.0 | 0.0 | 0.0 | 0.0 |
| $r_2$ (microns) | 8.00 | 7.73 | 8.69 | 7.63 |
| $\Delta_{3MIN}$ (%) | −0.30 | −0.31 | −0.35 | −0.33 |
| $r_3$ (microns) | 13.94 | 14.69 | 12.09 | 12.73 |
| $r_1/r_2$ | 0.59 | 0.60 | 0.53 | 0.62 |
| $V_3$ (%-sq. microns) | −39.7 | −48.6 | −24.8 | −34.5 |
| $\Delta_4$ (%) | 0.00 | 0.00 | 0.00 | 0.00 |
| $r_4$ (microns) | 62.5 | 62.5 | 62.5 | 62.5 |
| LP11 theoretical cutoff (microns) | 0.985 | 0.954 | 0.990 | 1.001 |
| MFD @ 1064 (microns) | 8.03 | 7.85 | 7.93 | 7.77 |
| MFD @ 1310 (microns) | 9.18 | 9.00 | 9.14 | 8.85 |
| Aeff at 1310 nm (sq. microns) | 64.70 | 62.10 | 63.90 | 60.30 |
| Pin array bend loss @ 1310 (dB) | 11.40 | 11.66 | 12.32 | 6.48 |
| Dispersion @ 1310 nm (ps/nm/km) | 0.30 | 0.01 | −0.59 | 0.32 |
| Slope @ 1310 nm (ps/nm²/km) | 0.094 | 0.095 | 0.094 | 0.094 |
| Zero dispersion wavelength (nm) | 1307 | 1310 | 1316 | 1307 |
| Cabled fiber cutoff (nm) | 1016.8 | 1009.3 | 969.2 | 1026.3 |

FIGS. 2B and 2C illustrates relative refractive index profiles Δ(%) versus fiber radius r of the fiber Examples 1 and 8, respectively. For example, the embodiment Example 1 fiber has an alpha (alpha value, α) of 11 and a more narrow but deeper (more negative) refractive index trench region than that of the embodiment of Example 8 fiber. The embodiment Example 8 fiber has an alpha (alpha value, α) of 2.4, and a wider, but shallower refractive index trench region.

The optical fiber 6 according to Tables 1A and 1B can also have one or more of the following properties.

In an example, the outer radius $r_1$ of core region 10 is in the range from 3.6 to 5.4 microns and the maximum relative refractive index $\Delta_{1MAX}$ is in the range from 0.25% to 0.4%, or from 0.25% to 0.38%, or from 0.27% to 0.35%. In some embodiments, the outer radius $r_1$ of core region 10 is in the range from 4 to 5 microns and the maximum relative refractive index $\Delta_{1MAX}$ is in the range from 0.25% to 0.4%, or from 0.25% to 0.38%, or from 0.27% to 0.35%.

In some embodiments, the outer radius $r_3$ of the trench region 30 is in the range from 11 to 20 microns, the minimum relative refractive index $\Delta_{3MIN}$ is less than −0.25%, and the trench volume $V_3$ is less than −20% Δ-sq. microns. In some embodiments, the outer radius $r_3$ of the trench region 30 is in the range from 11.5 to 15 microns, the minimum relative refractive index $\Delta_{3MIN}$ is less than −0.2%, and the trench volume is less than −20% Δ-sq. microns and greater than −60% Δ-sq. microns.

In the exemplary embodiments of Tables 1A and 1B the outer radius $r_4$ of the outer cladding region 40 is at least 60 microns and the relative refractive index $\Delta_4$ is in the range from −0.05% to 0.10%. In some embodiments the outer cladding region 40 is pure silica.

In an example, the inner cladding region 20 has an outer radius $r_2$ in the range from 5 to 11 microns and a relative refractive index $\Delta_2$ in the range from −0.10% to 0.10%, with the depressed index cladding region 30 surrounding the inner cladding region. In an example, the inner cladding region 20 has an outer radius $r_2$ in the range from 7 to 10 microns and a relative refractive index $\Delta 2$ in the range from $-0.05\%$ to $0.05\%$. In some embodiments, inner cladding region 20 is pure silica.

According to some embodiments the cable cutoff wavelength is less than 1060 nm, for example less the 1060 nm, less than 1040 nm, less than 1025 nm, less than 1020 nm, less than 1010 nm, less than 1005 nm, or even not greater than 1000 nm. In some embodiments the cuttoff wavelength is between 950 nm and 1060 nm, or between 950 nm and 1030 nm, or between 950 nm and 1025 nm, or between 950 nm and 1000 nm, or between 970 nm and 1025 nm.

Fabricated Example

Table 1C below sets forth measured parameters for an optical fiber 6 embodiment that has permits operating wavelengths $\lambda$ between about 980 and 1360 nm windows (and therebetween) and has a cable cutoff wavelength that is less than 1060 nm. The measured refractive index profile for Example 9 fiber embodiment is illustrated in FIG. 2D. The parameters of the alpha profile of the core were obtained by performing a least-squares fit to the measured relative refractive index profile in the radial range between $r_0=0.925$ microns and $r_f=4.05$ microns.

TABLE 1C

| Parameter | Example 9 |
| --- | --- |
| $\Delta_{1MAX}$ (%) | 0.340 |
| $r_1$ (microns) | 4.15 |
| $V_1$ (%-sq. microns) | 3.06 |
| Alpha | 3.56 |
| $\Delta_2$ (%) | 0.0 |
| $r_2$ (microns) | 8.30 |
| $\Delta_{3MIN}$ (%) | -0.50 |
| $r_3$ (microns) | 12.40 |
| $r_1/r_2$ | 0.56 |
| $V_3$ (%-sq. microns) | -41.2 |
| $\Delta_4$ (%) | 0.00 |
| $r_4$ (microns) | 62.5 |
| LP11 theoretical cutoff (microns) | 0.983 |
| MFD @ 1064 (microns) | 7.73 |
| MFD @ 1310 (microns) | 8.72 |
| Aeff at 1310 nm (sq. microns) | 60.20 |
| Pin array bend loss @ 1310 (dB) | 8.33 |
| Dispersion @ 1310 nm (ps/nm/km) | -1 |
| Slope @ 1310 nm (ps/nm$^2$/km) | 0.094 |
| Zero dispersion wavelength (nm) | 1320.6 |
| Cabled fiber cutoff (nm) | 955 |

In addition to the measured parameters provided in Table 1C for the Example 9 fiber embodiment, Example 9 fiber exhibits: a bend loss BL at 1310 nm of 0.25 dB/turn at a bend diameter of 10 mm (when bent around a 10 mm diameter mandrel), a bend loss BL of 0.13 dB/turn at a bend diameter of 15 mm (when bent around a 15 mm diameter mandrel), a bend loss BL of 0.066 dB/turn at a bend diameter of 20 mm (when bent around a 20 mm diameter mandrel), and a bend loss BL of 0.004 dB/turn at a bend diameter of 30 mm (when bent around a 30 mm diameter mandrel). The fiber also exhibits: a bend loss BL at 1550 nm of 2.43 dB/turn at a bend diameter of 10 mm, a bend loss BL of 1.12 dB/turn at a bend diameter of 15 mm, a bend loss BL of 1.02 dB/turn at a bend diameter of 20 mm, and a bend loss BL of 0.35 dB/turn at a bend diameter of 30 mm. The measured attenuation was 0.77 dB/km at a wavelength of 1060 nm, 0.325 dB/km at a wavelength of 1310 nm, and 0.206 dB/km at a wavelength of 1550 nm.

Integrated Systems and Optical Communication Systems

In Addition to the Large Effective Area, Low Cutoff Optical Fibers Disclosed Herein, the present disclosure extends to integrated systems that incorporate the fibers, and optical communication systems that employ the integrated systems.

Figure 3A:
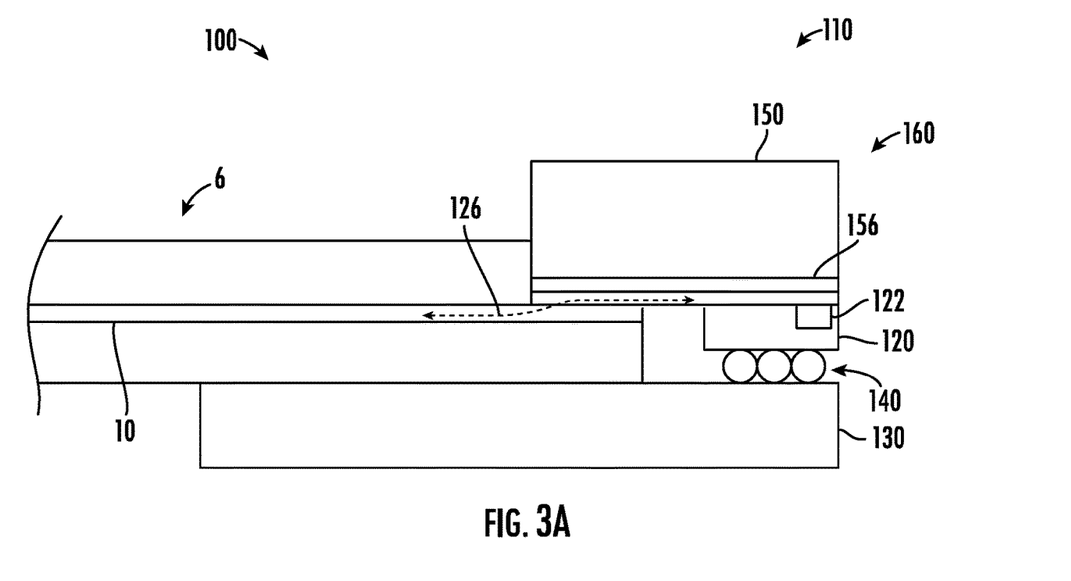
FIG. 3A is close-up side view of an example integrated system that utilizes the large effective area, low cutoff optical fiber disclosed herein.

FIG. 3A is a side view of an example integrated system 100 that includes an example VCSEL-based transceiver 110 and fiber 6 as disclosed herein. The example transceiver 110 includes a photonic integrated circuit (PIC) 120 with an active device 122. The active device 122 may comprise a light source (e.g., LED, vertical cavity surface-emitting laser (VCSEL), distributed feedback (DFB) laser or semiconductor laser) and a light receiver (e.g., a photodetector). The PIC 120 is electrically connected to a printed circuit board (PCB) 130 via electrical connections 140 shown by way of example in the form of a ball-grid array. A waveguide structure 150 that includes at least one waveguide 156 is operably disposed adjacent PIC 120 so that light 126 emitted by a light-emitting active device 122 is coupled into the waveguide. The waveguide 156 is shown by way of example as being edge-coupled to fiber 6 so that light 126 can couple between the waveguide and the fiber. The waveguide structure 150 and PIC 120 constitute a photonic device 160.

The active device 12 is coupled to the optical fiber 6. In one embodiment, the active device 122 operates at or near 1060 nm (e.g. 990 nm, 1015 nm, 1040 nm and/or 1064 nm). In an example, the active device 122 is a single-moded VCSEL. In another embodiment, the active device 122 operates at or near a wavelength of 1310 nm (e.g., 1260 nm-1360 nm). In an example, the active device 122 is a single-moded laser.

The integrated system 100 may also include peripheral devices such as modulators, detectors, multiplexers, demultiplexers, etc., as known in the art.

The low cutoff provided by fiber 6 reduces coupling losses between the fiber and waveguide 156 of photonic device 160 when an operating wavelength is less than 1080 nm. Conventional single-mode fibers have cable cutoff wavelengths above 1200 nm and are therefore multi-moded at wavelengths less than 1200 nm. Using these fibers in conjunction with lasers operating in the 980-1080 nm window can produce degradation of the signal integrity due to multi-path interference (MPI). While it is possible to strip out the LP11 and other higher order modes by wrapping the fiber around a small diameter mandrel, but this can result in several dB of loss and is not effective with bend-insensitive fibers. It is therefore desirable to have a fiber that has a cable cutoff less than 1060 nm with a sufficiently high MFD to ensure low coupling losses, so that the fiber may also be used with transceivers that operate at wavelengths near 1310 nm. Advantageously, the embodiments of the optical fibers 6 described herein have a cable cutoff less than 1060 nm and a sufficiently high MFD (9.5 microns≥MFD≥8.6 microns), so that optical fibers 6 may be advantageously utilized with transceivers (transmitters and/or receivers) that operate at wavelengths near 1310 nm.

Figure 3B:
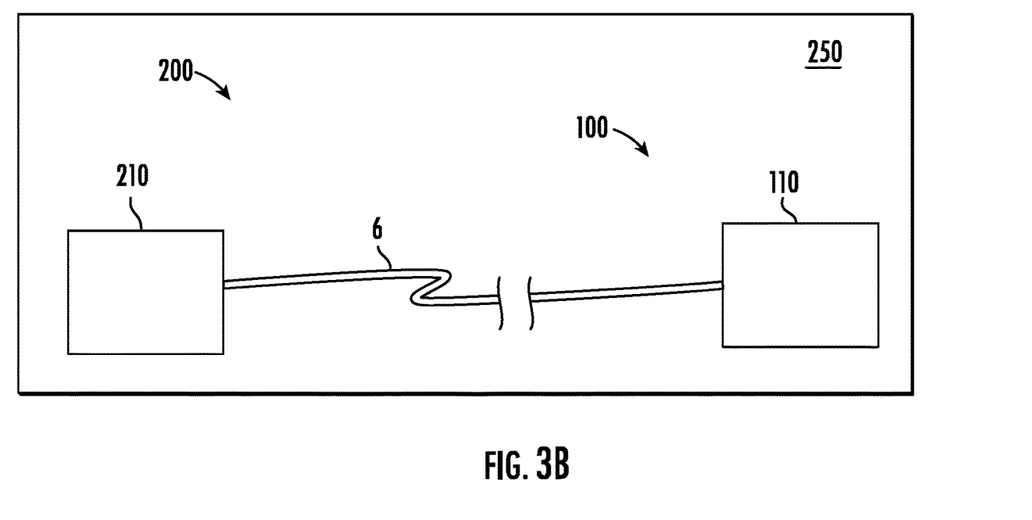
FIG. 3B is a schematic diagram of an example optical communication system that includes the integrated system of FIG. 3A operably connected to a remote device, wherein the optical system is shown by way of example as being deployed in a data center.

FIG. 3B is a schematic diagram of an example optical communication system 200 that includes the integrated system 100, with the fiber 6 thereof optically connected to a remote device 210. In an example, optical communication system 200 is deployed within a data center 250 and the remote device 210 is a data-center device, such as a server (e.g., rack-mounted server) or another data-center component such as a router, a switch, etc.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. An optical fiber comprising:
   a silica based core region comprising an outer radius $r_1$ in the range from 3.6 to 5.4 microns, a maximum relative refractive index $\Delta_{IMAX}$ between 0.25 to 0.4%, and core volume between 3.0%-sq. microns and 4.5%-sq. microns, wherein said core region has an alpha value α<5;
   a depressed index cladding region surrounding said core region, said depressed index cladding region comprising an inner radius $r_2$ such that $r_1/r_2$ is greater than 0.4 and less than 0.65, an outer radius $r_3$ and a minimum relative refractive index $\Delta_{3MIN}$ less than −0.2%, and a trench volume less than −20% Δ-sq. microns;
   an outer cladding region surrounding said depressed index cladding region, said outer cladding region comprising an outer radius $r_4$; and
   wherein said optical fiber has: a mode field diameter (MFD) at 1310 nm such that 9.5 microns≥MFD≥8.6 microns; a cable cutoff wavelength 1060 nm; a bending loss BL at 1310 nm, as determined by mandrel wrap test using a mandrel comprising a diameter of 15 mm, less than 1.0 dB/turn; and a zero dispersion wavelength ($\lambda_0$) between 1300 nm and 1324 nm.

2. The optical fiber of claim 1, wherein said core region has an alpha value α of 2.41 to 2.78.

3. The optical fiber of claim 1, wherein $r_1/r_2$ is greater than 0.5 and less than 0.65.

4. The optical fiber of claim 1, wherein said outer radius $r_1$ is in between 3.6 microns and to 5.0 microns, and said maximum relative refractive index $\Delta_{IMAX}$ is between 0.25% to 0.38%.

5. The optical fiber of claim 4 wherein said outer radius $r_3$ is 12 to 20 microns.

6. The optical fiber of claim 5, wherein said outer radius $r_4$ is at least 60 microns and a relative refractive index $\Delta_4$ is in the range from −0.05% to 0.10%.

7. The optical fiber of claim 1, wherein said optical fiber has an effective area at 1310 nm of at least 60 sq. microns.

8. The optical fiber of claim 1, wherein the core region has an effective area between between 58 and 72 sq. microns and the fiber exhibits dispersion between −1.0 ps/nm/km and 1.0 ps/nm/km at a wavelength of 1310 nm.

9. The optical fiber of claim 1, wherein the mode field diameter (MFD) at 1310 nm is between 8.6 microns and 9.5 microns.

10. The optical fiber of claim 1, wherein the mode field diameter (MFD) at 1310 nm is between 8.8 and 9.4 microns.

11. The optical fiber of claim 1 wherein the cable cutoff wavelength is less than 1040 nm.

12. The optical fiber of claim 11, trench volume is between −60% Δ-sq. microns and −20% Δ-sq. microns.

13. The optical fiber of claim 1 wherein the cable cutoff wavelength is not greater than 1000 nm.

14. The optical fiber of claim 13, wherein said outer radius $r_4$ is at least 60 microns and said relative refractive index $\Delta_4$ is in the range from −0.05% to 0.10%.

15. The optical fiber of claim 1 wherein the bending loss BL at 1310 nm, as determined by the mandrel wrap test using a mandrel comprising a diameter of 20 mm, is less than 0.2 dB/turn.

16. The optical fiber of claim 1 wherein the bending loss BL at 1310 nm, as determined by the mandrel wrap test using a mandrel comprising a diameter of 15 mm, is less than 0.5 dB/turn.

17. The optical fiber of claim 1, further comprising:
   an inner cladding region surrounding said core region, said inner cladding region comprising an outer radius $r_2$ in the range from 7 to 10 microns and a relative refractive index $\Delta_2$ in the range from −0.05% to 0.1%, said depressed index cladding region surrounding said inner cladding region.

18. The optical fiber of claim 1 wherein the core region has an effective area between 62 and 70 sq. microns and the fiber exhibits dispersion between −1.0 ps/nm/km and 1.0 ps/nm/km at a wavelength of 1310 nm.

19. An integrated system comprising
   the optical fiber according to claim 1; and
   one or more lasers optically coupled to the optical fiber and that emits light at one or more wavelengths between 1260 and 1360 nm.

* * * * *

UNITED STATES PATENT AND TRADEMARK OFFICE
CERTIFICATE OF CORRECTION

PATENT NO. : 11,287,567 B2
APPLICATION NO. : 16/419403
DATED : March 29, 2022
INVENTOR(S) : Scott Robertson Bickham et al.

It is certified that error appears in the above-identified patent and that said Letters Patent is hereby corrected as shown below:

In the Claims

In Column 13, Line 9, in Claim 1, delete "$\Delta_{IMAX}$" and insert -- $\Delta_{1MAX}$ --.

In Column 13, Line 24, in Claim 1, delete "1060" and insert -- $\leq 1060$ --.

In Column 13, Line 35, in Claim 4, delete "$\Delta_{IMAX}$" and insert -- $\Delta_{1MAX}$ --.

Signed and Sealed this
Thirty-first Day of May, 2022

Katherine Kelly Vidal
*Director of the United States Patent and Trademark Office*